United States Patent [19]

Weinberg et al.

[11] Patent Number: 4,585,492
[45] Date of Patent: Apr. 29, 1986

[54] RAPID THERMAL ANNEALING OF SILICON DIOXIDE FOR REDUCED HOLE TRAPPING

[75] Inventors: Zeev A. Weinberg, White Plains; Donald R. Young, Ossining, both of N.Y.

[73] Assignee: International Business Machines Corporation, Armonk, N.Y.

[21] Appl. No.: 635,391

[22] Filed: Jul. 30, 1984

[51] Int. Cl.$^4$ ................ H01L 21/265; B23K 27/00
[52] U.S. Cl. .................................... 148/1.5; 29/571; 29/576 B; 148/187; 148/DIG. 4; 357/91
[58] Field of Search ............... 148/1.5, 187; 29/571, 29/576 B; 357/91

[56] References Cited

U.S. PATENT DOCUMENTS 3,615,873 10/1971 Sluss, Jr. et al. .............. 148/1.5
4,431,900 2/1984 Delfino et al. .............. 219/121 LM

OTHER PUBLICATIONS

Powell et al, Jour. Vac. Sci. Technol. 20 (1982) 33.
Lai et al, Jour. Appl. Phys. 52 (1981) 5691.
Sieber et al, Phys. Stat. Sol. 749 (1982) K-9.
Greeuw et al, Solid St. Electronics 27 (Jan. 1984) 77.
Crosthwait et al, in Laser . . . Solid Interactions . . . Processing, ed. Gibbons, North-Holland, N.Y., 1980, p. 399.

Primary Examiner—Upendra Roy
Attorney, Agent, or Firm—Carl C. Kling

[57] ABSTRACT

Silicon dioxide insulating films for integrated circuits are provided with enhanced electronic properties, including enhanced dielectric breakdown of MOS insulating layers and reduced trapping of holes by exposing a metal oxide semiconductor wafer including an exposed silicon dioxide layer, in an ambient of flowing oxygen gas, to heating radiation from a halogen lamp for a duration on the order of 100 seconds to achieve annealing temperature on the order of 1000° C.

For reduced hole trapping, the ambient gas is oxygen and the annealing temperature is on the order of 1000° C. for a duration on the order of 100 seconds, depending on the oxide thickness.

Nitrogen, occurring at the silicon-silicon dioxide interface as a result of previous processing including a long anneal in nitrogen, increases the improvement of the silicon dioxide by the subsequent rapid thermal annealing in oxygen.

5 Claims, 2 Drawing Figures

RAPID THERMAL ANNEALING OF SILICON DIOXIDE FOR REDUCED HOLE TRAPPING

BACKGROUND OF THE INVENTION

1. Field of the Invention

This invention relates to integrated circuit production, and more particularly to a method for enhancing the electronic properties of silicon dioxide insulating layers in metal oxide semiconductor devices, decreasing hole trapping and thereby increasing radiation hardness, by a rapid thermal annealing of the integrated circuit wafer at a stage during production when the silicon dioxide insulating layer is exposed.

2. Description of the Prior Art

The prior art techniques for enhancing the electronic properties of silicon dioxide insulating layers in metal oxide semiconductor (MOS) devices includes the use of long anneals at 1000 C.

The prior art techniques do not teach nor suggest the rapid thermal annealing of silicon dioxide insulating layers in MOS device wafers, but rather require very long anneals, which do not provide the desired enhancement of electronic properties.

Various thermal treatments of semiconductor materials, as contrasted to thermal treatments of silicon dioxide insulating layers, are known in the prior art. Such treatments have application in healing ion implantation damage, in activating implanted dopants, and in other mechanisms affecting semiconductor properties; there is however no unified theory of thermal treatments which might predict success of a short anneal of silicon dioxide insulating layers.

SUMMARY OF THE INVENTION

Therefore, it is an object of the present invention to enhance electronic properties of silicon dioxide, to reduce hole trapping and thereby increase radiation hardness and improve the dielectric breakdown properties.

A feature of the invention is rapid heating of a semiconductor chip or wafer by controlled application of radiation from a high intensity halogen lamp, so as to carry out an annealing process without disruption of other processes or long waiting periods.

The advantage of the invention is its high quality and convenience; its production of the desired enhancements, increased radiation hardness and reduced hole trapping, are achieved without the extra effort and additional chance of contamination or unwanted diffusion inherent in longer anneals.

The foregoing and other objects, features and advantages of the invention will be apparent from the more particular description of the preferred embodiments of the invention, as illustrated in the accompanying drawing.

DESCRIPTION OF A PREFERRED EMBODIMENT OF THE INVENTION

Figure 1:
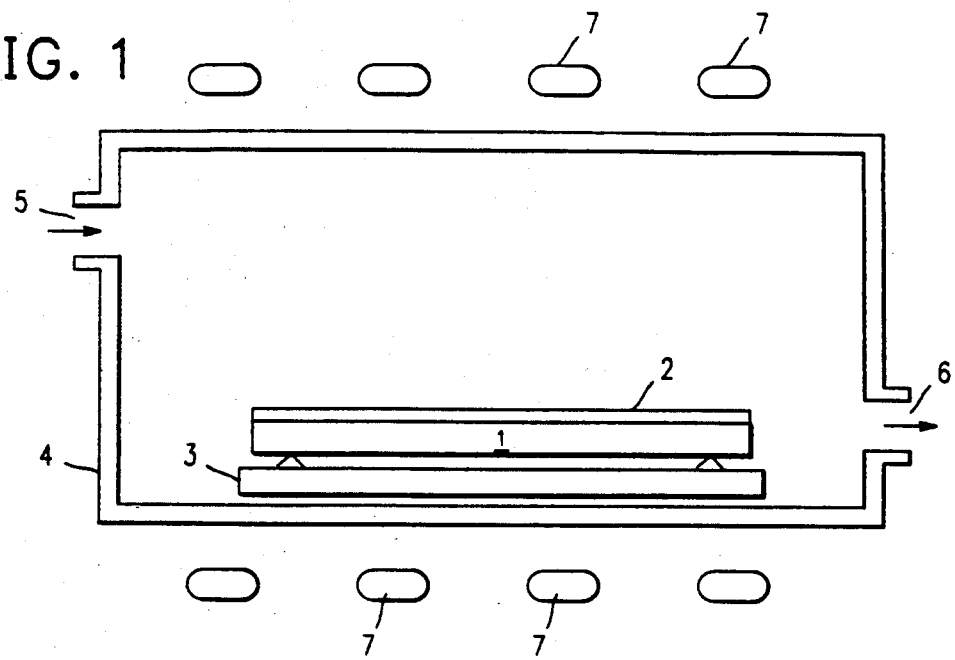
FIG. 1 is a schematic diagram of appropriate apparatus.

The invention is a process for providing reduced hole trapping characteristics to a silicon dioxide insulator film on a MOS integrated circuit wafer. FIG. 1 shows typical apparatus. The silicon semiconductor wafer 1 has silicon dioxide insulator 2 on its surface, which surface will subsequently have conductors deposited upon it. The wafer is supported on a quartz plate 3 and inserted into a quartz enclosure 4. The desired gas is flown into this enclosure at inlet port 5; the gas escapes at exit port 6. An array of lamps 7, which are typically tungsten halogen lamps, are turned on to heat wafer 1 rapidly to the desired annealing temperature for a short time.

The anneal of a silicon dioxide film of thickness on the order of 100–1000 Angstroms is carried out in an atmosphere of oxygen at atmospheric pressure. The preferred temperature and duration are 1000 C for 100 seconds; the range 10–300 seconds is effective, with a peak around 100 seconds.

Figure 2:
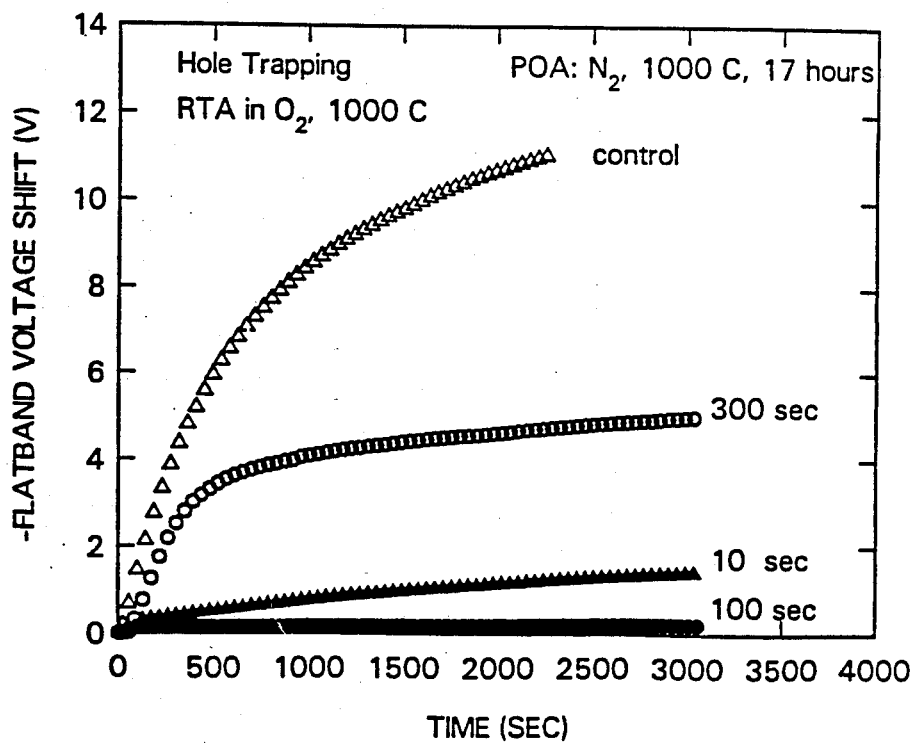
FIG. 2 is a graph showing hole trapping.

FIG. 2 shows the reduction in hole trapping achieved by the rapid thermal annealing; it is a graph of flatband voltage shifts as a function of hole injection time in MOS capacitor structures. The flatband voltage shifts are proportional to the amount of hole trapping in the silicon dioxide. The control curve shows high trapping in oxides before annealing. Other curves, labeled with annealing time for rapid thermal annealing (RTA) show improvement in the form of reduced hole trapping. In particular, the curve for 100 seconds shows drastically reduced hole trapping, approaching the 0 trapping level.

Improved RTA annealing characteristics are found when the RTA is subsequent to a nitrogen pretreatment, such as a long post oxidation anneal in nitrogen, which provides nitrogen atoms at the silicon-silicon dioxide interface. Such nitrogen pretreatment may typically be a post-oxidation anneal (POA) of seventeen hours in nitrogen at 1000 C.

Thus, while the invention has been described with reference to a preferred embodiment, those skilled in the art that various fast wafer or chip heating techniques may be used, and that changes in form and detail may be made without departing from the scope of the invention.

What is claimed is:

1. A process for enhancing electronic properties in a thin silicon dioxide insulating layer on an integrated circuit wafer characterized by
   (a) positioning the wafer inside an enclosure;
   (b) charging said enclosure with flowing oxygen; and
   (c) quickly heating the wafer by radiation heating to a temperature of approximately 1000 C. for 10–300 seconds.

2. A process for enhancing electronic properties in a thin silicon dioxide insulating layer on an integrated circuit wafer characterized by
   (a) positioning the wafer inside an enclosure;
   (b) charging said enclosure with flowing oxygen; and
   (c) quickly heating the wafer by radiation heating to a temperature of approximately 1000 C for a duration of approximately 100 seconds.

3. A process for enhancing electronic properties in a thin silicon dioxide insulating layer on an integrated circuit wafer according to claim 2 further characterized by
   (d) previously treating the wafer in a nitrogen atmosphere so as to provide nitrogen atoms at the silicon-silicon dioxide interface.

4. A process for enhancing electronic properties in a thin silicon dioxide insulating layer on an integrated circuit wafer according to claim 3 further characterized in that
   said nitrogen atmosphere pretreatment (d) is a post-oxidation anneal of multiple hours at annealing temperatures.

5. A process for enhancing electronic properties in a thin silicon dioxide insulating layer on an integrated circuit wafer according to claim 3 further characterized in that
   said nitrogen atmosphere pretreatment (d) is a post-oxidation anneal of seventeen hours at 1000 C.

* * * * *